United States Patent
Kurd et al.

(10) Patent No.: US 6,622,255 B1
(45) Date of Patent: Sep. 16, 2003

(54) DIGITAL CLOCK SKEW DETECTION AND PHASE ALIGNMENT

(75) Inventors: Nasser A. Kurd, Hillsboro, OR (US); Javed Barkatullah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 594 days.

(21) Appl. No.: 09/660,808

(22) Filed: Sep. 13, 2000

(51) Int. Cl.[7] .................................................. G06F 1/12
(52) U.S. Cl. ...................... 713/503; 713/401
(58) Field of Search ................. 713/400, 401, 713/500, 503

(56) References Cited

U.S. PATENT DOCUMENTS

| | | | |
|---|---|---|---|
| 3,989,931 A | | 11/1976 | Phillips |
| 5,121,010 A | * | 6/1992 | Hoshizaki et al. ............. 327/3 |
| 5,455,840 A | * | 10/1995 | Nakauchi et al. ........... 375/371 |
| 5,691,656 A | | 11/1997 | Sandusky |
| 5,748,487 A | | 5/1998 | Sawasaki et al. |
| 6,075,832 A | * | 6/2000 | Geannopoulos et al. .... 375/375 |
| 6,078,634 A | * | 6/2000 | Bosshart ..................... 375/376 |
| 6,265,904 B1 | * | 7/2001 | Killorn ......................... 327/12 |

FOREIGN PATENT DOCUMENTS

EP 0 637 137 A 1/1995

OTHER PUBLICATIONS

Dana Woesta, et al., "Digital–Phase Aligner Macro for Clock Tree Compensation with 70ps Jitter", ISSCC96/Session 8/Digital Clocks and Latches/Paper FA 8.4.

U.S. patent application Ser. No. 09/094,666, filed Jun. 15, 1998, entitled "Method and Apparatus for Clock Skew Compensation" by Dizon, et al.

U.S. patent application Ser. No. 09/489,153, filed Jan. 21, 2000, entitled "Hierarchical Clock Distribution System for Power–Down of Selective Units in an Integrated Circuit" by Bauer, et al.

* cited by examiner

Primary Examiner—Dennis M. Butler
(74) Attorney, Agent, or Firm—Blakely, Sokoloff, Taylor & Zafman LLP

(57) ABSTRACT

A skew measure circuit, an exclusion circuit, and an up/down counter are connected to form a skew detection circuit. The skew measure circuit asserts a first output signal if a first input clock leads a second input clock, and asserts a second output signal if the second clock leads the first clock. The exclusion circuit provides first and second digital pulse signals that represent the outputs of the skew measure circuit. The exclusion circuit also prevents the states of these pulse signals from changing, so long as the skew measure circuit is experiencing metastability. The up/down counter's count is incremented in response to the first pulse signal and decremented in response to the other pulse signal.

18 Claims, 8 Drawing Sheets

DIGITAL CLOCK SKEW DETECTION AND PHASE ALIGNMENT

FIELD OF THE INVENTION

This invention is generally related to techniques for phase aligning two digital clock signals.

BACKGROUND

The use of a digital clock signal in electronic systems provides an effective and low cost technique to synchronize events, so that the events can repeat at a high rate dictated by the clock signal. For instance, separate parts of a complex integrated circuit (IC) die may be responsible for generating different portions of a multiple bit value. This multi-bit value may need to be repeatedly read, in a very short time interval, as defined by a reference digital clock signal.

To ensure that the multi-bit value is timely available, multiple copies of the reference clock are generated and fed to the different parts of the IC die using a clock distribution network, so that each part of the IC die provides its portion of the multi-bit value in response to a rising edge of its copy of the reference clock. However, at very high clock rates, variations in the IC die manufacturing process, supply voltage, the operating temperature of the IC die and design mismatches can lead to serious misalignment of corresponding edges in the copies of the reference clock (referred to as "clock skew"), thereby endangering synchronous operation. The design of a robust clock distribution circuit which can operate reliably at very high clock rates is a challenging task that has become a significant portion of the development cost of large, complex IC dies.

A digital phase aligner, such as one based on a delay locked loop (DLL), can be used to automatically decrease clock skew, by for instance adjusting the binary-weighted delay of a variable-delay line to align each output of a clock distribution network to the clock input of an IC die. However, such a circuit may not be space-efficient, such that it might enjoy only limited use in IC dies and printed wiring boards having large clock distribution networks. Moreover, the conventional phase aligner design may not prove to be a sufficiently versatile macro, thus precluding its easy integration in a wide range of applications (beyond deskewing a clock distribution network.) Finally, the phase aligner may not be sufficiently accurate (achieve low skew and jitter) at high clock frequencies.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

According to an embodiment of the invention, a circuit capable of detecting skew between two digital input clock signals is disclosed. The circuit is particularly versatile because it can be used essentially unaltered in a wide range of phase alignment applications, including for instance, the dynamic adjustment of phase in different branches of a clock distribution network, reduction of static phase error in a phase locked loop (PLL) output, minimizing skew between multiple clock domains, and tuning the final clock output drivers of a clock distribution network. In addition, the detector circuit may be easily bypassed to, provide a variable skew output clock to test the robustness of manufactured logic circuitry. The circuit may also prove to be useful as part of a relative phase measurement device that provides a binary value that represents a relative phase difference between two digital input signals.

In addition to being versatile, the skew detection circuit is physically compact, thus encouraging its use in applications in which the circuit is replicated in relatively large numbers, such as in dynamically tuning the different branches of a large clock distribution network and also tuning final clock output drivers of such networks. This may be achieved without the difficulties surrounding a multiple PLL design for clocking a large die which may require not only unique wiring blockage, layout, power distribution, and characterization, but also additional interface circuitry for synchronizing different PLL-controlled clock domains. Thus, the skew detection circuit may enable a lower cost systematic option for solving phase alignment problems in large IC dies and board systems.

Figure 1:
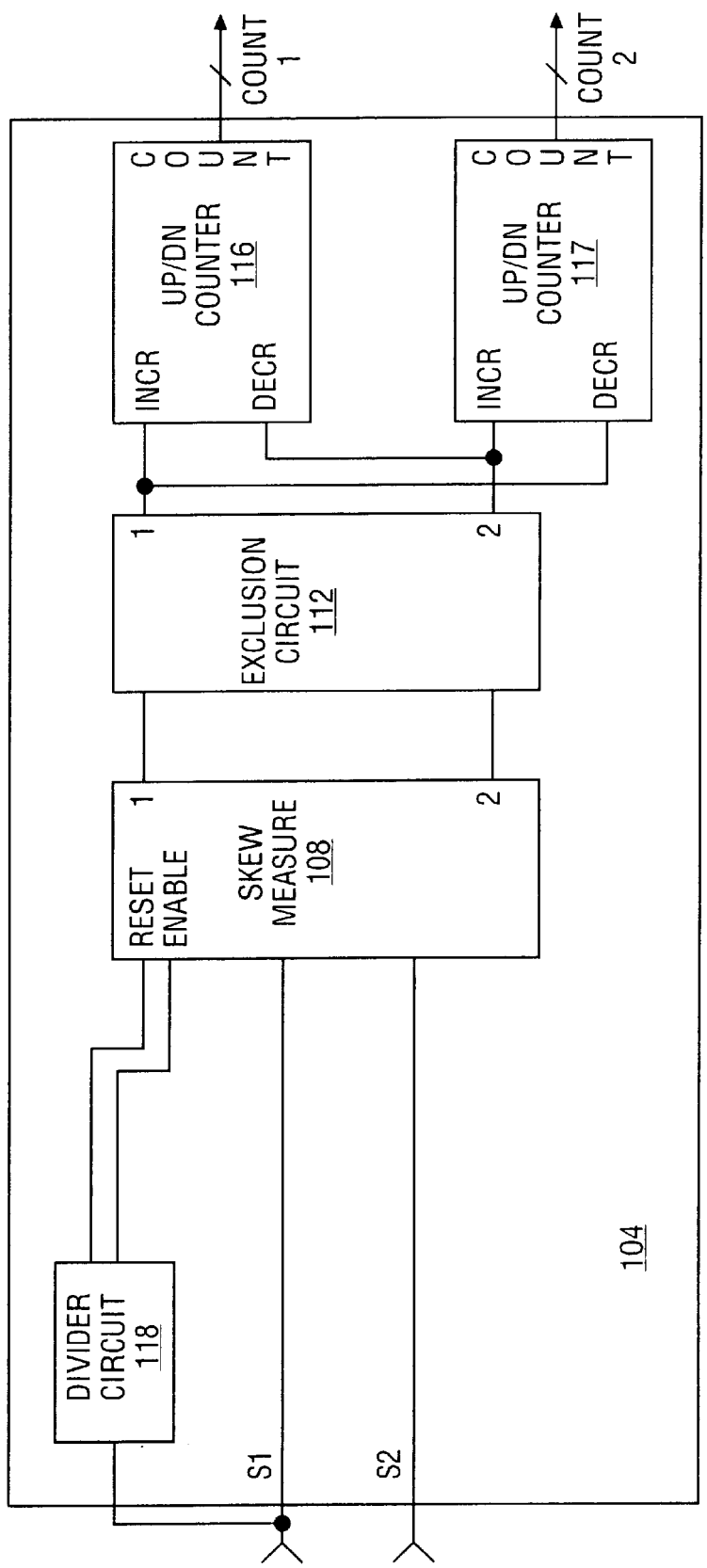
FIG. 1 illustrates a block diagram of a circuit according to an embodiment of the invention.

FIG. 1 illustrates a block diagram of a circuit 104 according to an embodiment of the invention. The circuit 104 features a skew measure block 108 that has two outputs. The first output is asserted if a first digital input clock signal S1 leads a second digital input clock signal S2. In contrast, the second output is asserted when S2 leads S1. When S1 and S2 are phase aligned, neither output of the block 108 is asserted.

In many instances, the skew measure block 108 may be susceptible to metastability in the event S1 and S2 become phase aligned. This metastability may result in unpredictable or undefined signal levels at the outputs of the block 108, and can adversely affect the application of the skew detection circuit for phase alignment. Accordingly, an exclusion circuit 112 is provided to prevent the propagation of this metastability. The exclusion circuit 112 generates at its outputs first and second digital pulse signals that are representative of corresponding outputs of the phase detector 108. In addition, the exclusion circuit 112 prevents the states of its output pulse signals from changing, so long as the skew measure circuit, as exhibited by its outputs, is experiencing metastability.

The outputs of the exclusion circuit 112 feed the increment and decrement inputs of an up/down counter 116 and an optional, second up/down counter 117. In one embodiment, the output count of the counter 116 is incremented by one least significant bit (LSB) in response to a rising edge detected at the increment input, while the count is decremented by one LSB in response to a rising edge detected at the decrement input. The second counter 117 is controlled in a complementary manner, so that its count decreases when that of the first counter 116 is increasing. An example of one alternative to this single bit per edge scenario is that the increment and decrement inputs simply determine the direction of the count, where the counter is otherwise being clocked by a separate clock signal (not shown). If the count ever reaches a maximum or minimum value, the counter does not roll over but stays at the maximum or minimum value, until the input which drives the count in the opposite direction is asserted.

In a further embodiment of the invention, the circuit 104 includes a divider circuit 118 to generate an enable signal that is coupled to qualify S1 and S2. This enable signal is obtained based on dividing down S1 or S2. The skew measure block 108 cannot detect any skew between S1 and S2, unless enable is asserted. The divider circuit 118 thus provides a physically compact and effective technique for controlling, and preferably lowering, the rate at which the skew measure block provides a lead/lag determination between S1 and S2. Such an effect is desirable to slow down the rate at which the counters 116, 117 are updated with the increment and decrement signals. Thus, for instance, if S1 and S2 are at approximately 1 GHz, then under some circumstances it may be appropriate to design the divider circuit 118 such that an enable pulse is asserted at a fraction of 1 GHz.

In a further embodiment of the invention, the divider circuit 118 also generates a reset signal that is coupled to reset the skew measure block 108 prior to the block 108 asserting any of its output signals. The output signals of the block 108 are both reset, prior to making another determination of lead/lag between S1 and S2. This reset signal may be derived in response to either S1 or S2, and, similar to the enable signal, may be periodically asserted at a rate that is a fraction of the clock frequency in S1 or S2.

Figure 2:
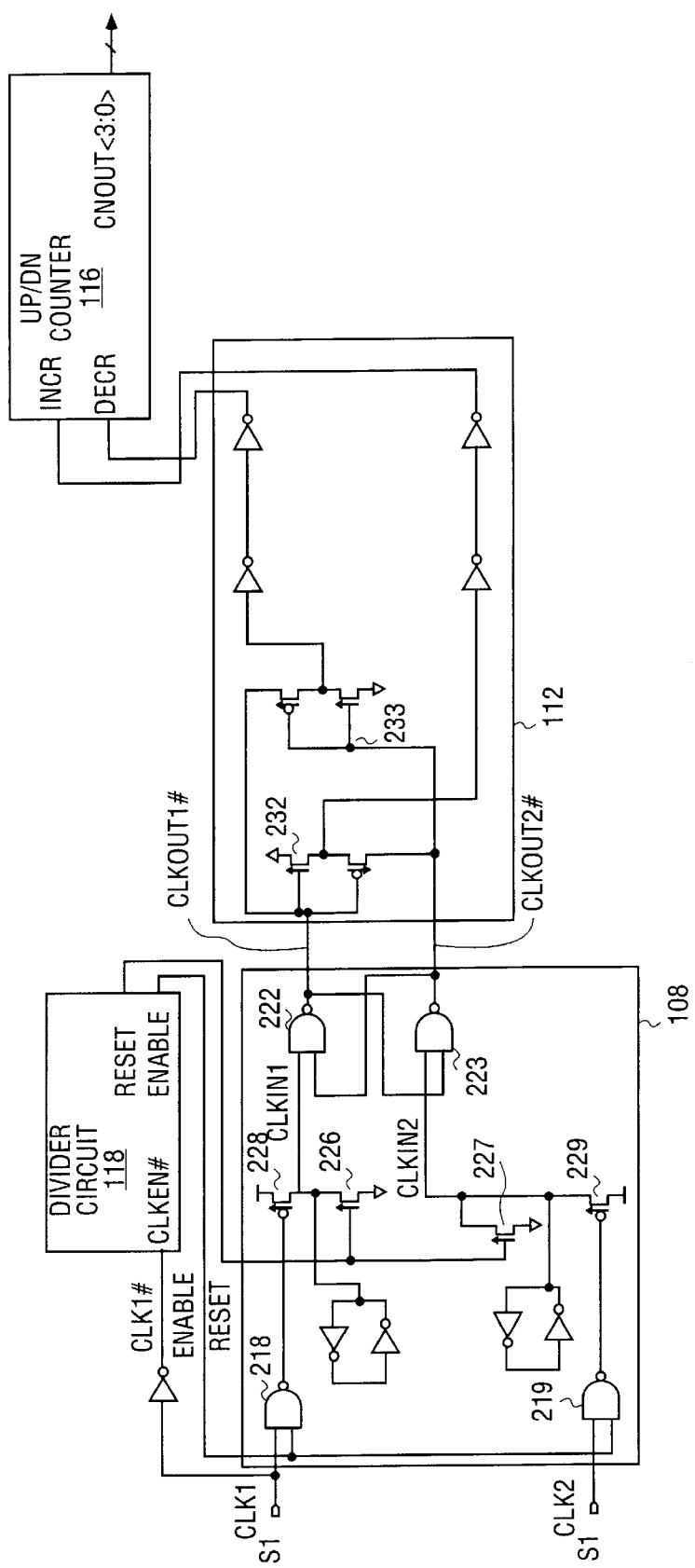
FIG. 2 illustrates a circuit schematic of an embodiment of the invention.

FIG. 2 illustrates a circuit schematic of an embodiment of the invention. The inputs S1 and S2 are qualified by the enable signal using NAND gates 218 and 219. A latch made of NAND gates 222 and 223 is preceded by reset circuitry that is based upon N-channel devices 226 and 227. When reset is deasserted, the qualified S1 and S2 may propagate to the inputs of the latch through P-channel devices 228 and 229. When reset, the outputs of the latch, clkout1# and clkout2#, are at logical high levels, and remain that way until reset is deasserted and a rising edge induced by either S1 or S2 appears at the input of the NAND gates 222 and 223. Thus, if S1 were to lead S2, the output of NAND gate 222 would make a high to low transition and at the same time prevent the output of NAND gate 223 from making a high to low transition.

However, if S1 and S2 were essentially phase aligned, such that the inputs of NAND gates 222 and 223 were to rise essentially simultaneously, then the outputs of these NAND gates would experience a period of metastability in which both output levels may begin to decrease simultaneously from their reset level. This simultaneous movement of both outputs of the NAND gates 222 and 223 from a logic high to a logic low level is a sign of metastability in that such output levels are not permissible levels for the latch. Thus, to avoid subjecting the counters 116, 117 to such undefined signal levels, the exclusion circuit 112 is provided to eliminate the propagation of metastability to the counters 116, 117.

In a particular embodiment, the exclusion circuit 112 includes a pair of inverters 232 and 233 each coupled to a separate output of the latch and each of which has the source electrode of its P-channel device shorted to the other output of the latch. When the outputs of the latch are at the same logic level (hi or low), the inverter outputs are low; when the latch outputs are both changing, both of the p-channel devices in the inverters stay in cutoff so long as the latch outputs differ by less than one threshold drop Vtp for either p-channel device. The inverter outputs thus remain unchanged so long as the absolute value of the difference between the outputs of the latch is less than a threshold voltage drop of the P-channel devices in the inverters. When one latch output "wins" over the other, such that the regenerative effect of the latch causes its outputs to diverge beyond Vtp towards their respective stable states, only one of the p-channel devices becomes inverted and the other remains in cutoff. Thus, the inverter outputs do not change during a metastable condition (in which the latch outputs are changing but they differ by less than Vtp) until the metastability has been resolved. In this way, the signals provided at the output of the exclusion circuit are representative of the outputs of the skew measure block 108, but remain unchanged until one of the latch outputs wins over the other, namely that the latch outputs diverge to a value greater than $|V_{tp}|$.

FIG. 2 also shows an embodiment of the divider circuit 118 as logic that includes a free running counter which is clocked by either S1 or S2. The reset and enable signals are derived from the count output of this counter. Referring now to the timing diagram of FIG. 3, it can be seen that, in this particular example, this counter is a 3 bit counter with count values 0–7, and where the reset signal is asserted each time the count reaches "5", while the enable signal is asserted each time the count reaches "7". As can be seen from the timing diagram of FIG. 3, when reset is asserted, the inputs to the latch, clkin1 and clkin2, are deasserted, which in turn deasserts the outputs of the latch, clkout1# and clkout2#, which in turn causes the signals at the increment and decrement inputs of the counter 116 to be deasserted. These counter input signals remain unchanged until the enable pulse is asserted, in this case two (2) S1 cycles following the assertion of the reset signal. The actual determination of lead/lag between S1 and S2 occurs while enable is asserted as shown. Since, in this case, S1 leads S2, clkin1 rises sufficiently early as compared to clkin2, such that clkout1# is asserted and thereby prevents clkout2# from being asserted. As a result, only the increment signal is asserted as shown. A similar result occurs when the count from the divider circuit wraps around and reaches "7" again, because S1 still leads S2, albeit by a lesser amount.

Figure 3:
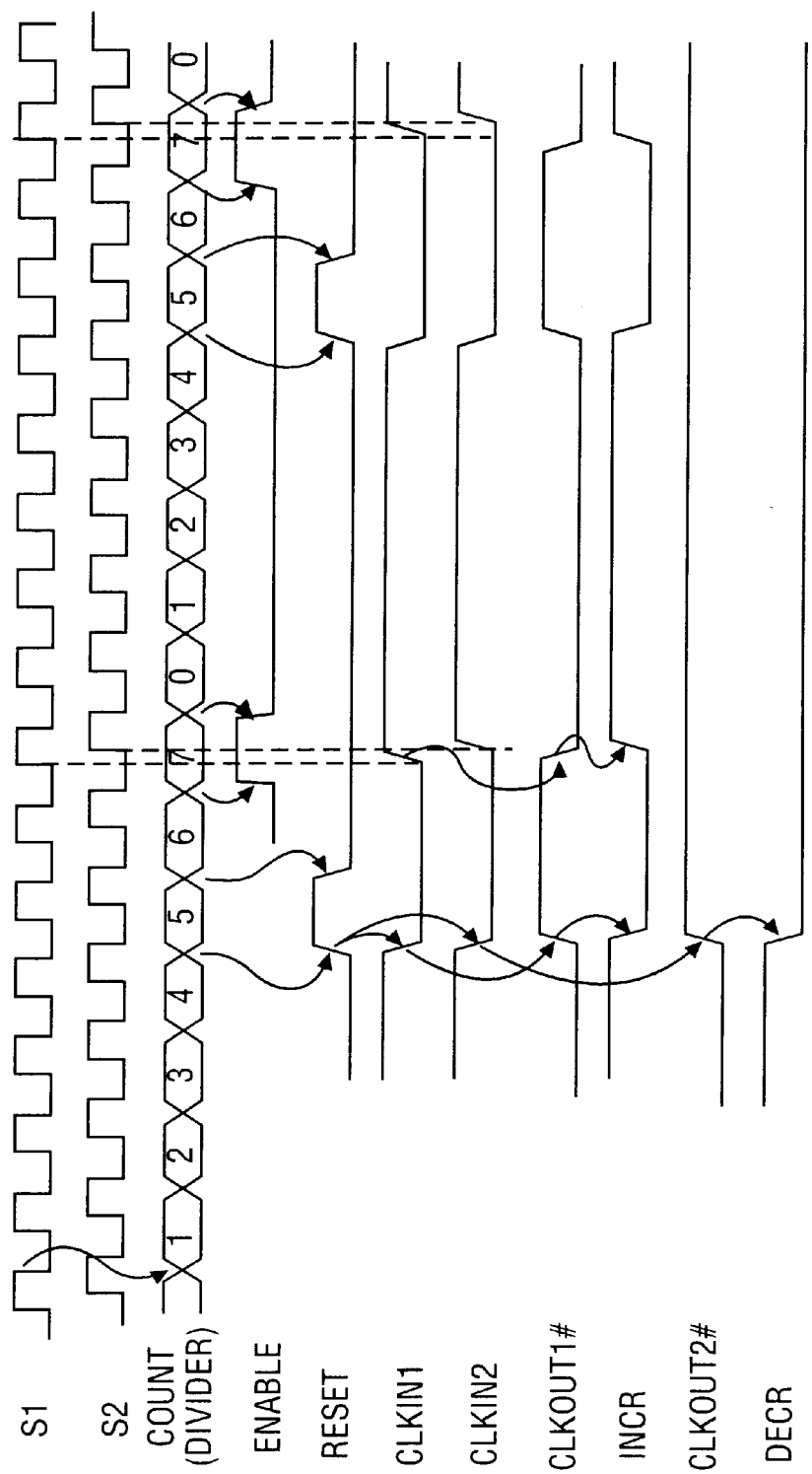
FIG. 3 shows a timing diagram of a clock distribution network with skew detection circuitry.

In the exemplary timing diagram shown in FIG. 3, the occurrence of two assertions of the increment signal causes the up/down counter 116 (see FIGS. 1 and 2) to increase its count upwards, either by exactly two LSBs or by a number of LSBs proportional to the period of time between successive equal counts provided by the filter. In either scenario, the count output of the up/down counters 116, 117 may be used for a variety of different purposes, depending upon the system application.

Figure 4:
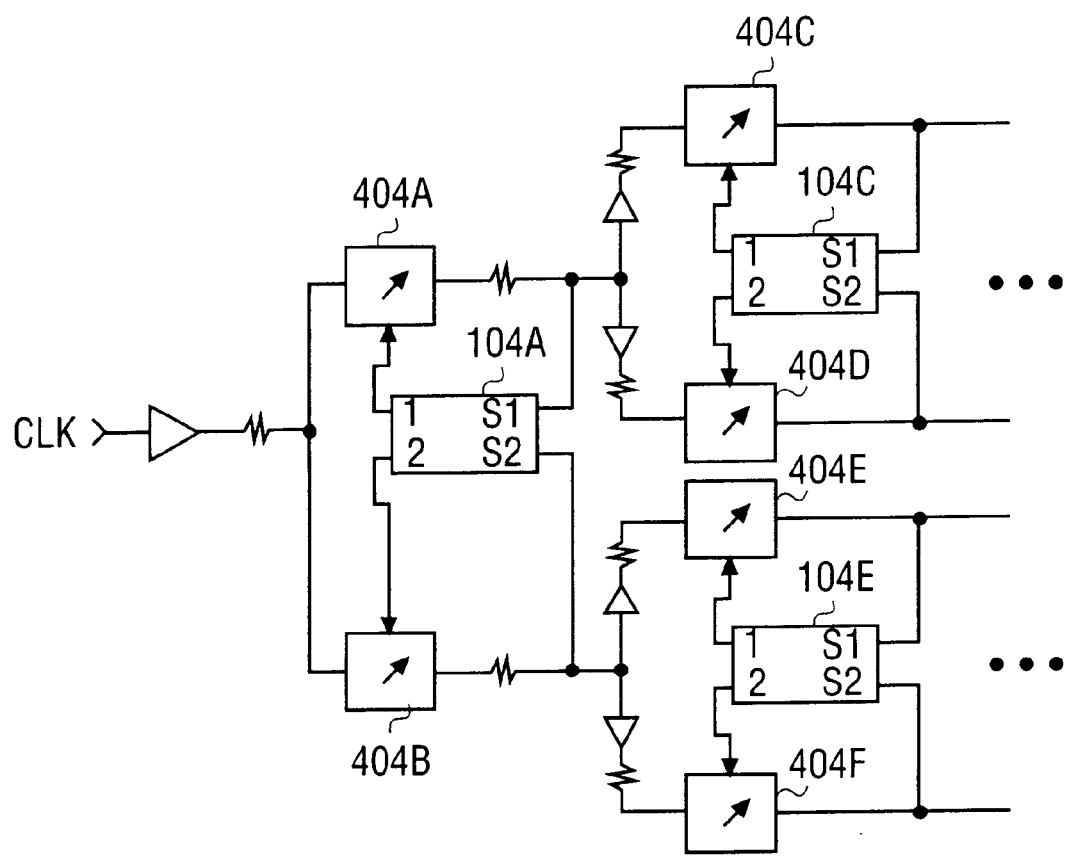
FIG. 4 illustrates a block diagram of a clock distribution network with skew detection circuitry.

FIG. 4 illustrates one system application in which the skew detection circuit 104 controls a pair of programmable delay circuits 404a and 404b in separate branches of a clock distribution network. An initial clock signal is first split into two branches containing digitally programmable delay circuits 404a and 404b. Each of these split clock signals is split into two clock signals, by branches containing delay circuits 404c, 404d and 404e, 404f. Such a splitting of clock signals may be repeated to increase the number of final clocks available through the network. A skew detection circuit 104 is used by each pair of branches, to align the phases of the clock signals at the output of the branches. For instance, the inputs to the circuit 104a are provided by respective programmable delay circuits 404a and 404b. The delay presented by each of these delay circuits is variable and may be adjusted according to the count value obtained from the respective output of the circuit 104a. In this particular example, the delay presented by each delay circuit increases in response to an increase in the count value.

Figure 5:
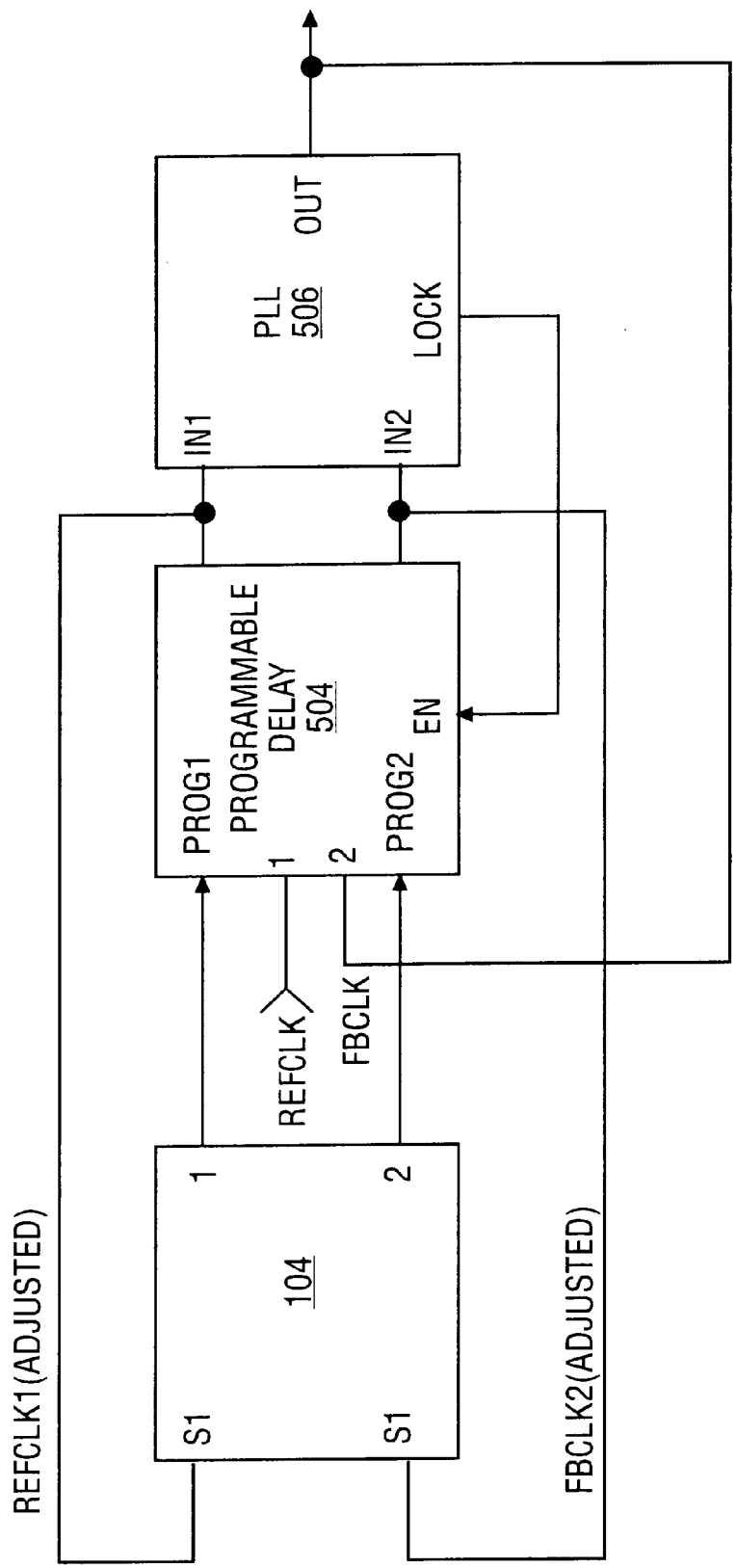
FIG. 5 depicts another application of the skew detection circuit, for reducing static phase error.

FIG. 5 illustrates another application of the skew detection circuit 104, this one for reducing static phase error that may appear in the output of a frequency control circuit, such as a PLL 506. A programmable delay circuit 504 provides adjusted reference and feedback clock signals to separate inputs of the circuit 104. The adjusted reference clock is obtained by delaying a reference clock signal in accordance with a first count received from the circuit 104, while the feedback clock is adjusted by delaying a feedback clock signal in accordance with the second, complimentary count provided by the circuit 104. The adjusted reference clock is also provided to one input of the frequency control circuit, in this example the PLL 506, while the adjusted feedback clock is provided to the second input of the frequency control circuit. The PLL adjusts the phase of its output signal to align its phase at its second input IN2 with the phase at its first input IN1. The feedback clock signal at the input of the programmable delay circuit 504 is derived from the phase and/or frequency locked output provided by the frequency control circuit.

In some circumstances, the circuit 104 and programmable delay circuit 504 may not be desirable for initially phase locking the output of the PLL 506. In that case, the delays presented by the programmable delay circuit 504 to both of its input signals may be set to be equal, fixed amounts so long as the PLL 506 has not phase locked. Once the PLL 506 achieves phase lock, it asserts a signal which then enables closed loop operation of the programmable delay circuit 504, to further reduce any static phase error between the reference clock and the output of the PLL 506.

Figure 6:
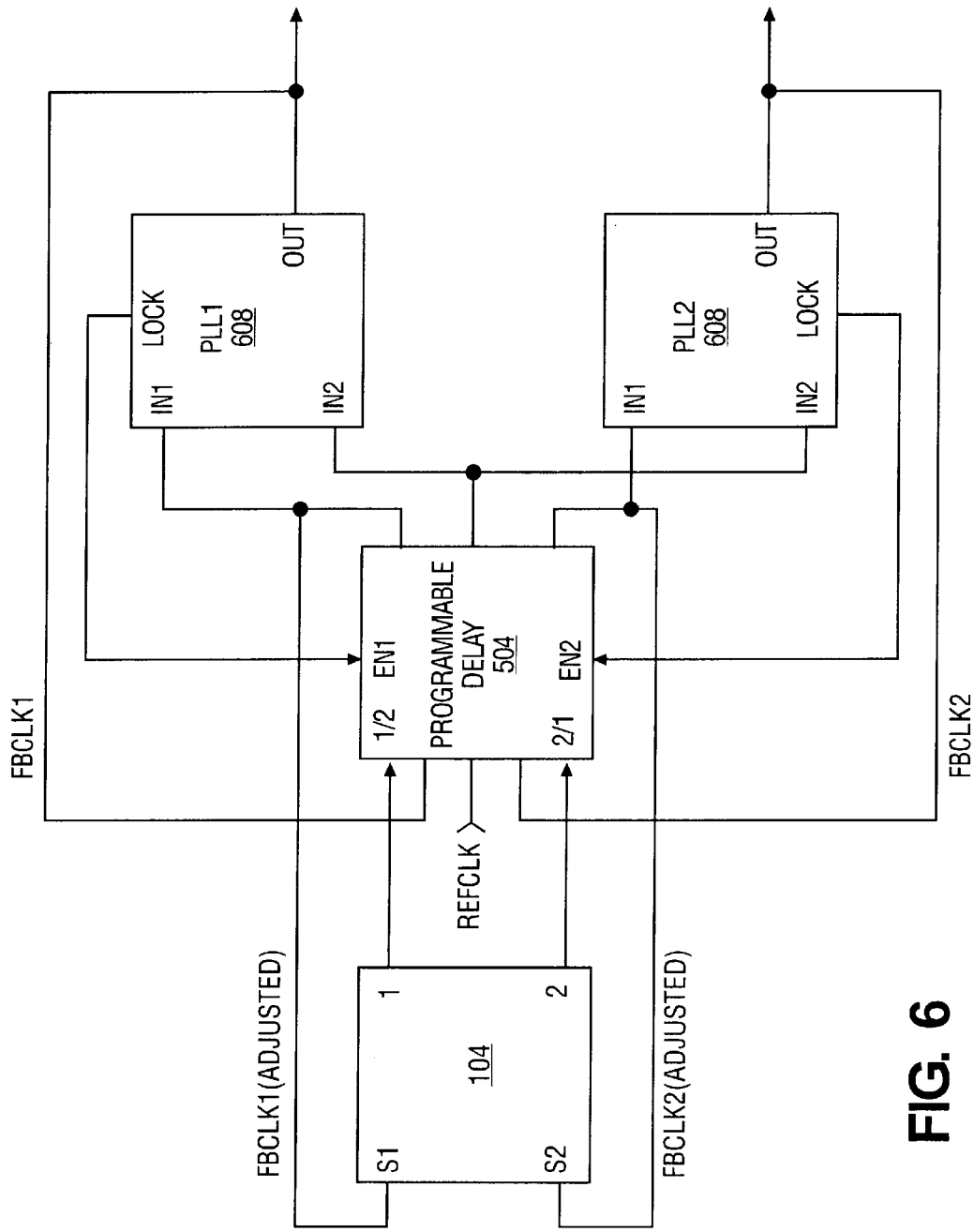
FIG. 6 shows a circuit schematic of another application of the skew detection circuit, for minimizing skew between different clock domains.

Turning now to FIG. 6, yet another application of the circuit 104 is depicted. In this case, the circuit 104 is used to help minimize the skew between multiple clock domains. There are two separate frequency control circuits, in this case PLL1 606 and PLL2 608, which provide output clocks of different frequencies, to be used for logic circuitry (not shown) having different clock domains. A reference clock is split into two by the programmable delay circuit 504 and fed to separate inputs of the two PLLs. The programmable delay circuit 504 is connected to the circuit 104 in the same way as shown in FIG. 5, except that there are now two feedback clock signals that may be delayed by the circuit 504. Thus, the inputs to the circuit 104 are the two adjusted feedback clocks which are delayed in accordance with the first and second counts of the circuit 104. Each PLL adjusts the phase and/or frequency of its output signal to match that of the reference clock input. Just as in the single-PLL application of FIG. 5, each PLL in FIG. 6 is coupled to enable the programmable delay of its corresponding feedback clock signal when the respective PLL is phase locked. In general, the reference clock which is provided to each of the frequency control circuits is subjected to a predetermined, fixed delay by the delay circuit 504.

Figure 7:
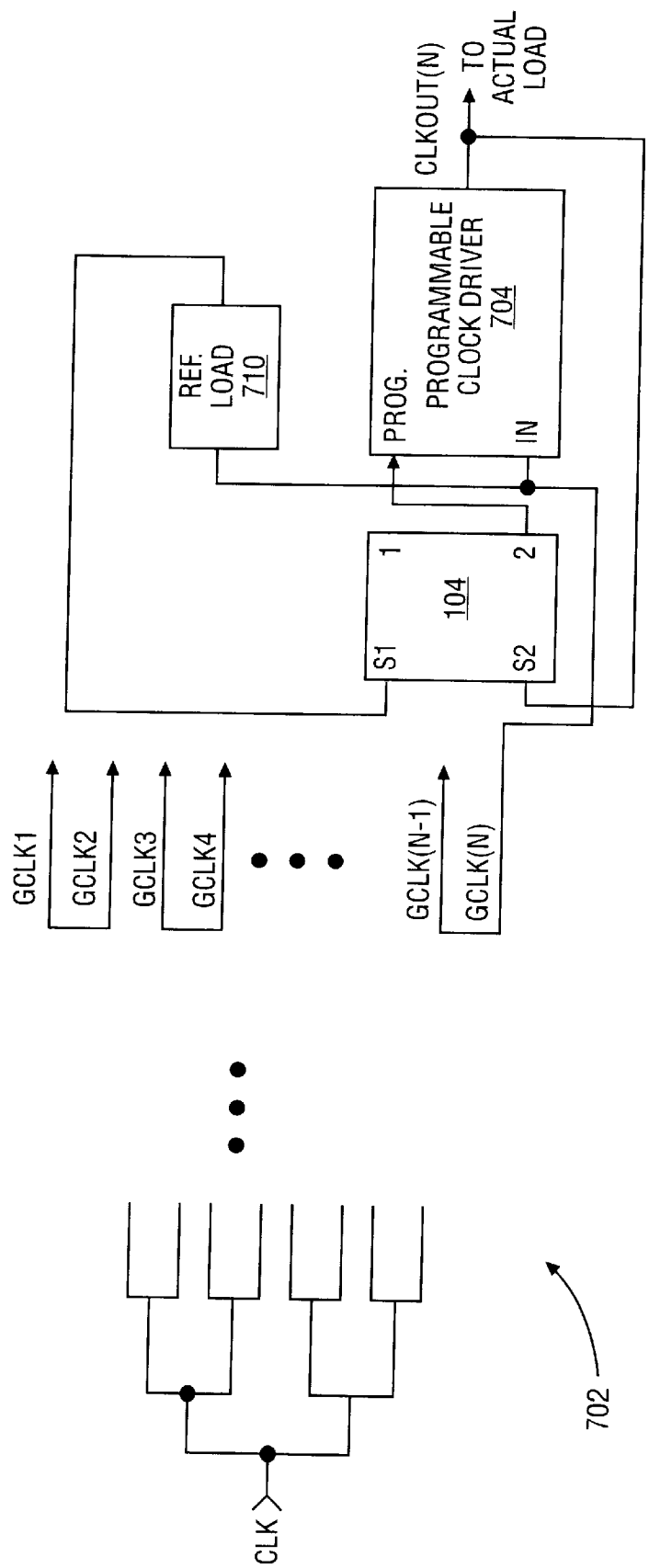
FIG. 7 depicts another application of the skew detection circuit, for providing tuned, final clock signals by a clock distribution network.

Referring now to FIG. 7, a further application of the circuit 104 is shown, in which the skew detection circuit 104, a load circuit 710, and a programmable clock driver 704 are connected to provide a tuned, final clock output driver, for each of a number of final clock signals provided by a clock distribution network 702. These final clock signals, gclk1, gclk2, . . . gclk(n), would be subjected to different skews depending upon the impedance of the load (not shown) that each one is expected to drive. Since each load impedance can vary, thereby causing different skews between the final clock signals, the skew detection circuitry is provided to adjust the phase and/or frequency of each actual loaded signal, clkout, to always match that of the reference loaded gclk. The load 710 may be a shunt impedance to ground, or it may be a two-port delay element that is selected such that its output simulates the effect of a fixed, nominal load that would have been seen by gclk if the skew detection circuit 104 were not being used. The circuit 104 responds to skew between clkout and the output of the reference load circuit 710, and in response generates a count (at the output marked "2"). In this example, this count value is decremented if the output of the reference load 710 leads clkout, where the lowered count value results in the programmable clock driver 704 changing the phase and/or frequency of clkout by, for instance, changing the strength of its output drive. The circuitry which includes the circuit 104, reference load 710, and programmable clock driver 704 is duplicated for each instance of gclk provided by the clock distribution network.

Figure 8:
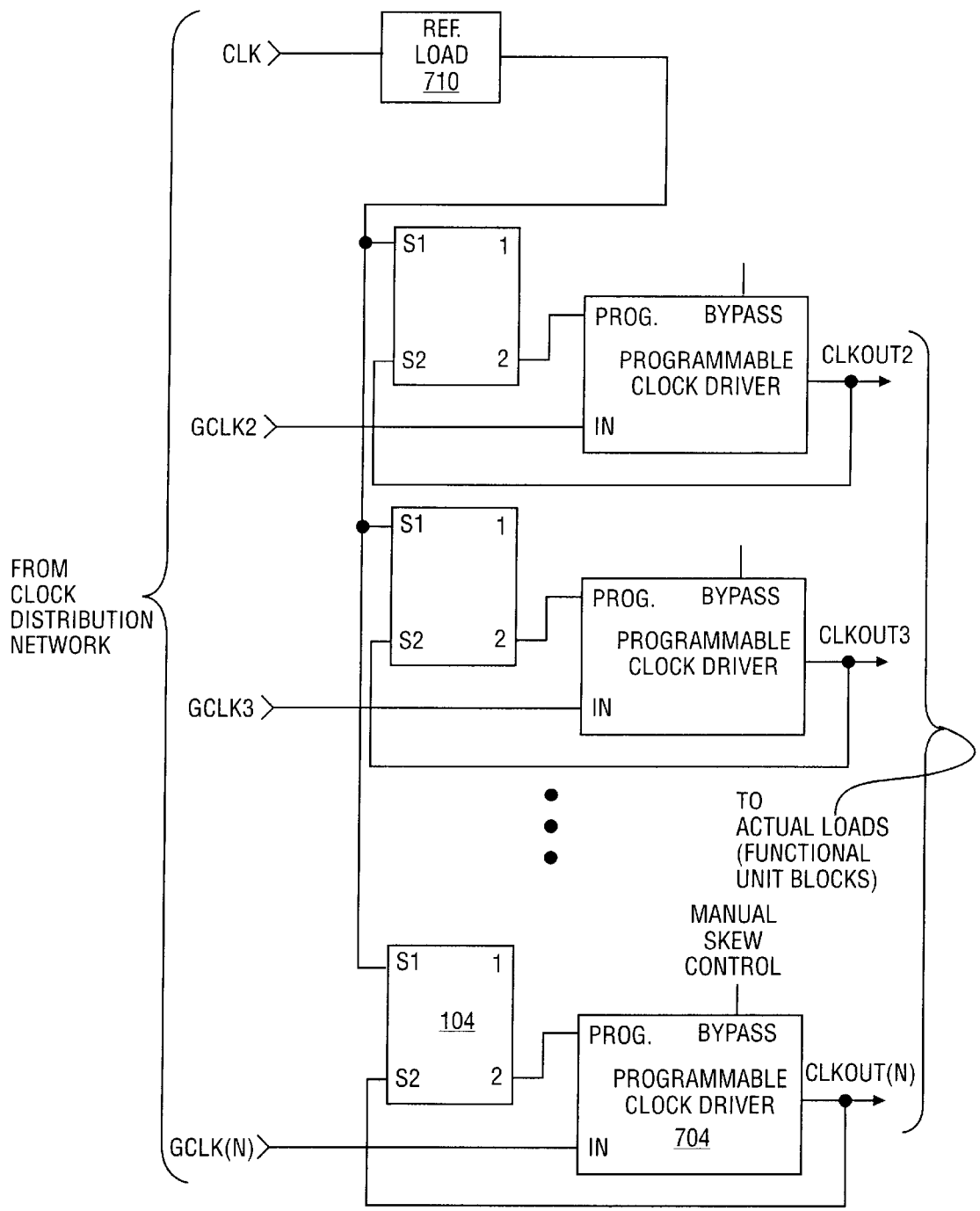
FIG. 8 shows an alternative to the circuit of FIG. 7 for tuning the final clock signals of a clock distribution network.

FIG. 8 illustrates a more space-efficient alternative to the final clock driver tuning mechanism shown in FIG. 7. In this embodiment, only one reference load circuit 710 is used for multiple instances of gclk. The first digital input clock to each skew detection circuit 104 is from the same output of the single, reference load circuit 710. A result substantially similar to the one in FIG. 7 may be achieved, where any skew between the different instances of clkout, that may be caused by variations in the impedance of the actual loads, such as the functional unit blocks in an IC die, is minimized.

Another application of the skew detection circuit is in a design for testability environment. In such an embodiment, the programmable clock driver 704 also has a bypass input, to receive a manual skew control value, which allows the skew between clkout and the reference-loaded gclk1 to be intentionally increased. Thus, a range of skew can be introduced into clkout relative to gclk1. This clkout signal is fed to logic circuitry under test (not shown). After manually skewing clkout, a response of the logic circuitry to this introduced skew may be recorded, to evaluate the robustness of the logic circuitry under test.

To summarize, various embodiments of a clock skew detection circuit and associated phase alignment applications have been described which reduce clock skew inaccuracies in manufactured IC dies and printed wiring boards. The ability to reduce clock skew dynamically, that is, while the IC die and/or board are operating as intended, shortens the testing time, thereby lowering manufacturing costs. In addition the compact and versatile design of the skew measure circuit allows easy re-use in a wide range of applications, thus shortening the time needed for circuit design and die/board layout, leading to faster product design cycles. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An article of manufacture comprising:

a skew measure circuit to assert (1) a first output signal if a first digital input clock signal leads a second digital input clock signal, and (2) a second output signal if the second digital input clock signal leads the first digital input clock signal;

an exclusion circuit coupled to the skew measure circuit, to (1) provide first and second digital pulse signals that are representative of the first and second output signals and (2) prevent the states of the first and second digital pulse signals from changing so long as the skew measure circuit is experiencing metastability; and a first up/down counter to provide a first count that is (1) incremented in response to the first digital pulse signal, and (2) decremented in response to the second digital pulse signal.

2. The article of manufacture of claim 1 further comprising:

a divider circuit to generate an enable signal that is coupled to qualify the first and second digital input clock signals, in response to one of the first and second digital input clock signals.

3. The article of manufacture of claim 2 wherein the divider circuit is to generate a reset signal that is coupled to reset the skew measure circuit, in response to one of the first and second digital input clock signals, prior to the skew measure circuit asserting one of the first and second output signals.

4. The article of manufacture of claim 1 further comprising:

a second up/down counter to provide a second count that is (1) decremented in response to the first digital pulse signal, and (2) incremented in response to the second digital pulse signal.

5. The article of manufacture of claim 4 further comprising:

a clock distribution network to provide the first and second digital input clock signals by first and second programmable delay circuits that are in respective branches of the network, the first and second delay circuits having respective control inputs to receive the first and second counts.

6. The article of manufacture of claim 4 further comprising:

a programmable delay circuit to provide (1) the first digital input clock signal by delaying a reference clock signal in accordance with the first count, and (2) the second digital input clock signal by delaying a feedback clock signal in accordance with the second count, the feedback clock signal being to be derived from a frequency control circuit.

7. The article of manufacture of claim 6 further comprising the frequency control circuit being coupled to enable the programmable delay circuit when it is phase locked.

8. The article of manufacture of claim 4 further comprising:

a programmable delay circuit to provide (1) the first digital input clock signal by delaying a first feedback clock signal in accordance with the first count, (2) the second digital input clock signal by delaying a second feedback clock signal in accordance with the second count, the first and second feedback clock signals to be derived from the outputs of first and second frequency control circuits that supply clocks to different clock domains.

9. The article of manufacture of claim 8 further comprising the first and second frequency control circuits being coupled to enable the programmable delay of the first and second feedback clock signals, respectively, when the first and second frequency control circuits are, respectively, phase locked.

10. The article of manufacture of claim 8 wherein each of the first and second frequency control circuits is to receive the same reference clock to which their outputs are phase locked.

11. The article of manufacture of claim 1 wherein the first count increments by one in response to each low to high transition in the first digital pulse, until reaching a maximum count.

12. The article of manufacture of claim 1 wherein the first count increments by a plurality of clock cycles while the first digital pulse is asserted.

13. An article of manufacture comprising:

means for detecting whether a first digital input clock signal leads or lags a second digital input clock signal;

means for providing first and second digital pulse signals that are representative of detecting that the first clock leads the second clock and that the second clock leads the first clock, respectively, the first and second digital pulse signals having fixed states while the detection means is experiencing metastability; and means for providing a binary variable which changes in opposite directions in response to the first and second digital pulse signals.

14. The article of manufacture of claim 13 further comprising:

means for dividing one of the first and second digital input clock signals and then qualifying the first and second digital input clock signals, prior to detecting whether the first clock leads or lags the second clock using the qualified first and second clocks.

15. The article of manufacture of claim 14 further comprising:

means for resetting the detection means in response to one of the first and second digital input clock signals, prior to detecting whether the first clock leads or lags the second clock using the qualified first and second clocks.

16. A method comprising:

detecting whether a first digital input clock signal leads or lags a second digital input clock signal;

providing first and second digital pulse signals that are representative of detecting that the first clock leads the second clock and that the second clock leads the first clock, respectively, the first and second digital pulse signals having fixed states while the detection means is experiencing metastability; and providing a binary variable which changes in opposite directions in response to the first and second digital pulse signals.

17. The method of claim 16 further comprising:

dividing one of the first and second digital input clock signals to qualify the first and second digital input clock signals prior to detecting whether the first clock leads or lags the second clock using the qualified first and second clocks.

18. The method of claim 17 further comprising:

resetting the first and second digital pulse signals in response to one of the first and second digital input clock signals, prior to detecting whether the first clock leads or lags the second clock using the qualified first and second clocks.

* * * * *